(12) United States Patent
Ahn et al.

(10) Patent No.: US 11,193,955 B2
(45) Date of Patent: Dec. 7, 2021

(54) GUIDE PLATE FOR PROBE CARD AND PROBE CARD HAVING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 25 days.

(21) Appl. No.: 16/794,147

(22) Filed: Feb. 18, 2020

(65) Prior Publication Data

US 2020/0271693 A1 Aug. 27, 2020

(30) Foreign Application Priority Data

Feb. 26, 2019 (KR) .................. 10-2019-0022490

(51) Int. Cl.
*G01R 1/073* (2006.01)

(52) U.S. Cl.
CPC ..... *G01R 1/07378* (2013.01); *G01R 1/07342* (2013.01)

(58) Field of Classification Search
CPC .................. G01R 1/07378; G01R 1/07342
See application file for complete search history.

(56) References Cited

U.S. PATENT DOCUMENTS

| | | | | | |
|---|---|---|---|---|---|
| 6,005,405 | A | * | 12/1999 | Slutz | G01R 1/07371 324/754.08 |
| 6,024,579 | A | * | 2/2000 | Bennett | H01R 13/2435 439/289 |
| 2011/0043239 | A1 | * | 2/2011 | Tomita | H01R 13/2414 324/756.03 |
| 2016/0274147 | A1 | * | 9/2016 | Hsu | G01R 1/07378 |
| 2021/0102975 | A1 | * | 4/2021 | Ahn | G01R 1/07371 |
| 2021/0238763 | A1 | * | 8/2021 | Ahn | C25D 11/246 |

FOREIGN PATENT DOCUMENTS

JP 2017075383 A * 4/2017
KR 101719912 B1 3/2017

* cited by examiner

*Primary Examiner* — Paresh Patel

(57) ABSTRACT

The present invention provides a guide plate for a probe card. The guide plate for the probe card according to the present invention includes: a first guide plate including a plurality of first pin insertion holes formed therein, and made of an anodic oxide film; and a second guide plate disposed to be spaced apart from the first guide plate by a predetermined distance, and including a plurality of second pin insertion holes through which probe pins passing through the first pin insertion holes pass, wherein a buffer part is provided at least partially on each of an upper portion and a lower portion of the first guide plate.

9 Claims, 4 Drawing Sheets

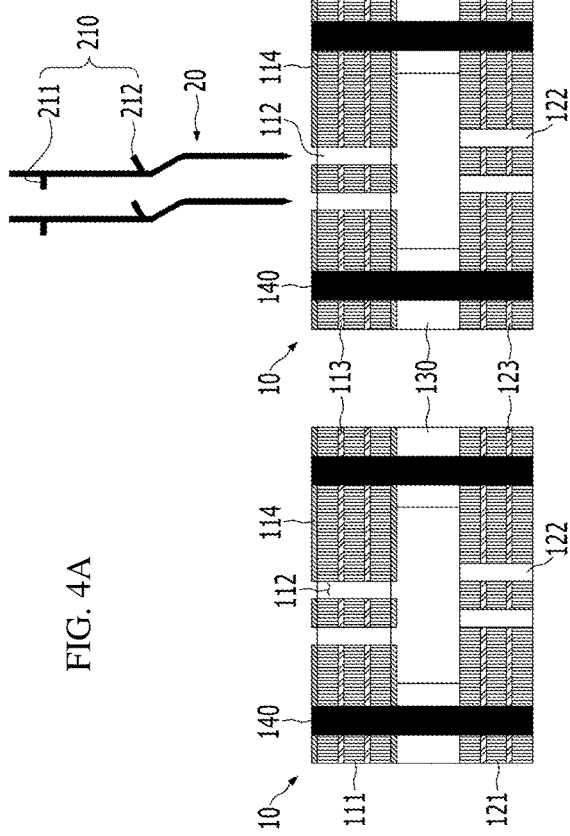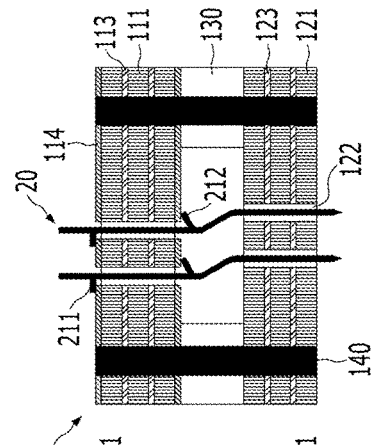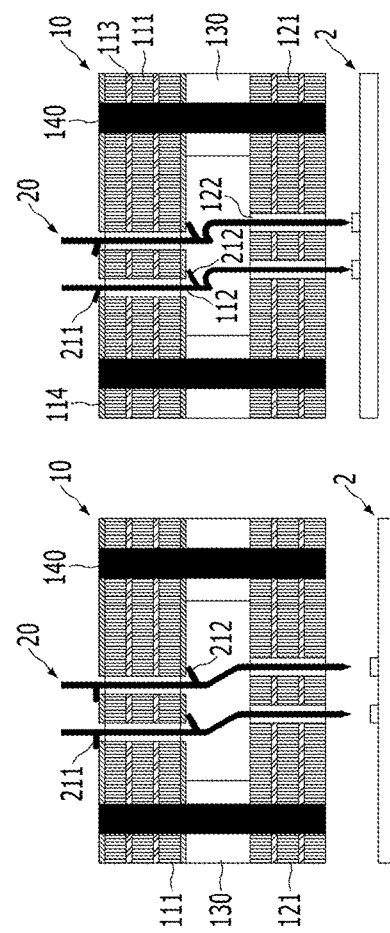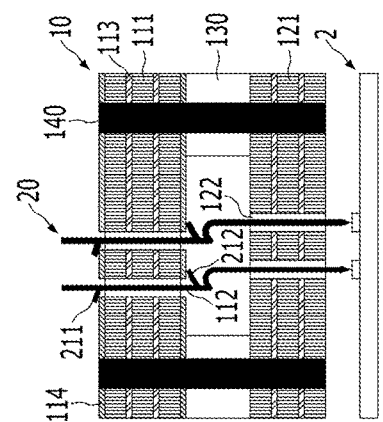

GUIDE PLATE FOR PROBE CARD AND PROBE CARD HAVING SAME

CROSS REFERENCE TO RELATED APPLICATION

The present application claims priority to Korean Patent Application No. 10-2019-0022490, filed Feb. 26, 2019, the entire contents of which is incorporated herein for all purposes by this reference.

BACKGROUND OF THE INVENTION

Field of the Invention

The present invention relates generally to a guide plate for a probe card and a probe card having the same. More particularly, the present invention relates to a guide plate for a probe card, whereby insertion of probe pins into the guide plate is facilitated and a surface of the guide plate is prevented from being damaged by the probe pins, and to a probe card having the same.

Description of the Related Art

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines determine whether the chips are defective on the basis of signals checked from the applied electrical signals is mainly used.

A probe card is a device that connects a semiconductor wafer (or a semiconductor device) and test equipment to test the operation of the semiconductor device. The probe card serves to transmit electricity while connecting probe pins provided on the probe card to a wafer, and then sort defective semiconductor chips on the basis of feedback signals received thereby.

The probe card may be divided into a cantilever type in which the ends of pins are bent and stacked horizontally, a vertical type in which pins are arranged vertically, and a microelectromechanical systems (MEMS) type in which probe pins are formed using micromachining technology depending on the shape of the probe pins.

In a vertical-type probe card, probe pins are inserted and guided into pin insertion holes formed in a guide plate for a probe card.

An example of such a guide plate for a probe card disclosed in Korean Patent No. 10-1719912 (hereinafter referred to as "Patent Document 1").

In a ceramic guide plate for a probe card of Patent Document 1, a plurality of green sheets are stacked and pressed to form a green bar, and one surface of the green bar is irradiated with laser light to form through-holes into which probe pin are inserted.

However, the ceramic guide plate of ceramic material as described above has a low transmittance and thus is problematic in that it may be difficult to insert the probe pins, and due thereto, a manufacturing time and a cost of manufacturing the probe card may increase.

Furthermore, each of the through-holes formed through the irradiation by the laser light has a large opening area of the surface to which the laser light is irradiated, so that the through hole is not vertically formed and but has an inclined hole shape with a large area on either of an upper portion or a lower portion. Accordingly, when the probe pins come into contact with the semiconductor wafer (or the semiconductor device), the probe pins may be shaken to cause a change in the position of the probe pins, which may lead to a reduction in reliability of the probe card.

Furthermore, thermal deformation of the green bar may occur due to heat generated upon the irradiation of the laser light, which may cause a problem in that a plurality of through-holes may not be precisely formed.

Moreover, the irradiation of the laser light takes a lot of time and is very costly, and thus, there is a problem in that manufacturing time and cost of the probe card may increase.

Meanwhile, a plurality of pin holding portions is formed in each of the probe pins. The pin holding portions are formed to protrude from one side of the probe pin, and serves to prevent the probe pin inserted into the guide plate from being separated externally of the guide plate. Herein, the pin holding portions may have elasticity so as not to interfere with the insertion of the probe pin.

When the probe pins come into contact with the semiconductor wafer (or the semiconductor device) to perform testing, the probe pins may be shaken up and down, and thus, the pin holding portions may inevitably come into contact with the surface of the guide plate. That is, a problem occurs that the surface of the guide plate may be damaged due to the pin holding portions.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-1719912

SUMMARY OF THE INVENTION

Accordingly, the present invention has been made keeping in mind the above problems occurring in the related art, and an objective of the present invention is to provide a guide plate for a probe card, whereby insertion of probe pins into the guide plate is facilitated and a surface of the guide plate is prevented from being damaged by the probe pins, and to a probe card having the same.

In order to achieve the above objective, according to one aspect of the present invention, there is provided a guide plate for a probe card, the guide plate including: a first guide plate including a plurality of first pin insertion holes formed therein, and made of an anodic oxide film; and a second guide plate disposed to be spaced apart from the first guide plate by a predetermined distance, and including a plurality of second pin insertion holes through which probe pins passing through the first pin insertion holes pass, wherein a buffer part is provided at least partially on each of an upper portion and a lower portion of the first guide plate.

Furthermore, the first guide plate may be provided transparently, and the second guide plate may be provided opaquely.

Furthermore, the second guide plate may be provided by coloring a surface of an anodic oxide film.

Furthermore, the second guide plate may be made of a ceramic material.

Furthermore, the buffer part may be made of a polymer or an SU-8 photoresist.

Furthermore, the buffer part may be made of a transparent material.

The guide plate may further include: a mask layer made of an adhesive material on an upper portion or a lower portion of each layer of each of the first guide plate and the second guide plate, the first guide plate and the second guide plate each of which is configured with a plurality of layers, and including through-holes corresponding to the first pin insertion holes and the second pin insertion holes.

Furthermore, the mask layer may be made of an epoxy resin.

Furthermore, the mask layer may be made of a transparent material.

According to another aspect of the present invention, there is provided a probe card, including: a first guide plate including a plurality of first pin insertion holes formed therein, and made of an anodic oxide film; a second guide plate disposed to be spaced apart from the first guide plate by a predetermined distance, and including a plurality of second pin insertion holes; and a plurality of probe pins each of which includes a protrusion-shaped pin holding portion, and sequentially inserted into and guided into the first pin insertion holes and the second pin insertion holes, wherein a buffer part is provided on each of an upper portion and a lower portion of the first guide plate, and the pin holding portion of each of the probe pins comes into contact with the respective buffer parts.

As described above, according to the guide plate for the probe card and the probe card having the same according to the present invention, due to the fact that a guide plate located at an upper location is provided transparently and a guide plate located at a lower location is provided opaquely, it is possible to facilitate insertion of the probe pins.

Furthermore, it is possible to prevent the surface of the guide plate from being damaged due to the pin holding portions of the probe pins.

Furthermore, due to the provision of the mask layers of an adhesive material provided between the layers of the guide plate configured with the plurality of layers, it is possible to facilitate joining of the layers of the guide plate, while enabling etching of the pin insertion holes.

BRIEF DESCRIPTION OF THE DRAWINGS

The above and other objectives, features, and other advantages of the present invention will be more clearly understood from the following detailed description when taken in conjunction with the accompanying drawings, in which:

FIGS. 4A, 4B, 4C, 4D, and 4E are sectional views illustrating that probe pins are inserted into the guide plate for the probe card of FIG. 1.

DETAILED DESCRIPTION OF THE INVENTION

Figure 1:
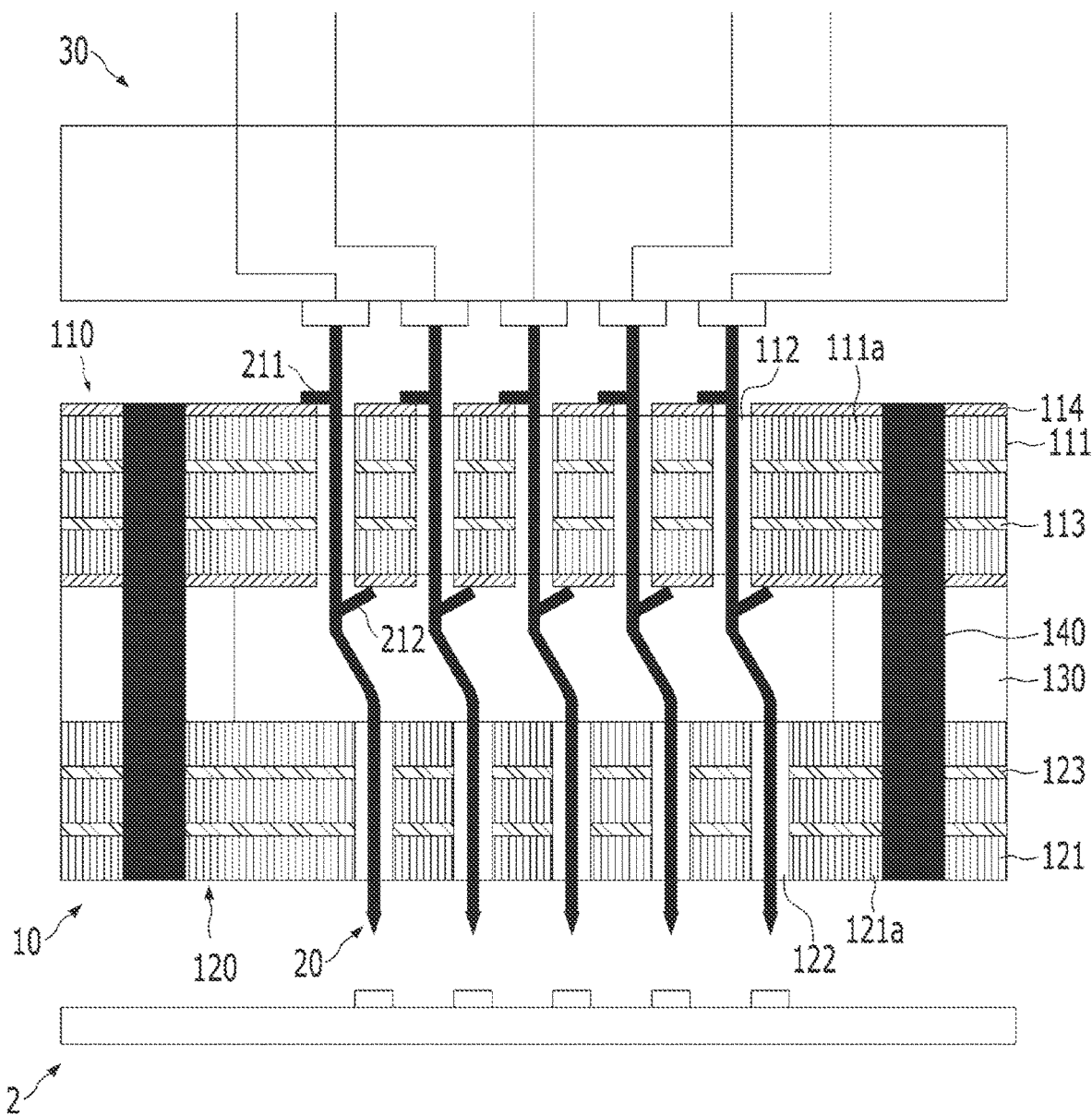
FIG. 1 is a sectional view schematically illustrating a probe card according to an exemplary embodiment of the present invention.

Hereinbelow, exemplary embodiments of the present invention will be described in detail with reference to the accompanying drawings. Throughout the drawings, the same reference numerals will refer to the same or like parts.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

Hereinafter, exemplary embodiments of the present invention will be described in detail with reference to the accompanying drawings.

Figure 2:
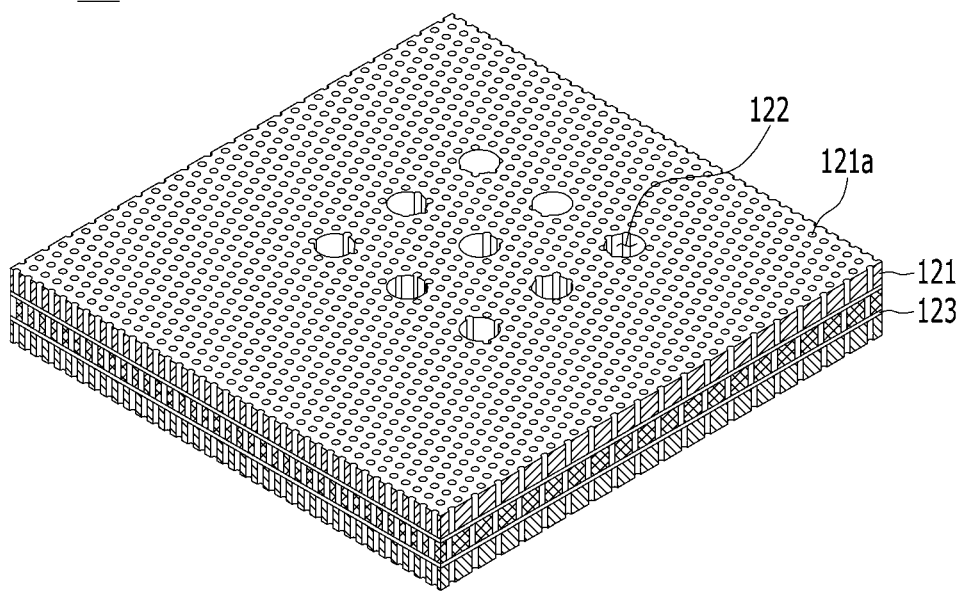
FIG. 2 is a perspective view illustrating a guide plate for the probe card of FIG. 1.

FIG. 1 is a sectional view schematically illustrating a probe card according to an exemplary embodiment of the present invention, and FIG. 2 is a perspective view illustrating a guide plate for the probe card of FIG. 1.

Referring to FIGS. 1 and 2, a probe card 1 checks a state such as disconnection or short of a circuit, and includes a guide plate 10, probe pins 20, and a space transformer 30. Although not illustrated in the drawings, the probe card 1 may further include an interposer and/or a printed circuit board (PCB) on the space transformer 30.

In detail, the probe card 1 is positioned above a wafer 2 on which circuits to be tested are formed and is connected to a variety of external equipment. The probe card 1 is configured to move upwardly and downwardly relative to the wafer 2 and checks formation of a normal circuit. In FIG. 1, the probe card 1 is illustrated as being moved upwardly relative to the wafer 2.

The guide plate 10 is where the probe pins 20 are inserted, and includes a first guide plate 110 made of an anodic oxide film, and a second guide plate 120 disposed to be spaced apart from the first guide plate 110 by a predetermined distance. Herein, each of the probe pins 20 may be configured such that one side thereof has a bent shape, and an upper side thereof has a pin holding portion 210 having a protrusion shape. In detail, the pin holding portion 210 is to prevent the probe pin 20 from being separated from the guide plate 10 and may include a first pin holding portion 211 and a second pin holding portion 212 spaced apart from each other by a predetermined distance. Herein, the distance between the first pin holding portion 211 and the second pin holding portion 212 may be defined by the thickness of the first guide plate 110. Furthermore, the probe pin 20 may be made of an elastic material.

The first guide plate 110 includes a plurality of first bodies 111 provided as anodic oxide films. Herein, since the first bodies 111 are provided as anodic oxide films, the first bodies 111 may be transparently provided. Furthermore, the first bodies 111 are provided as anodic oxide films having a coefficient of thermal expansion of 2 to 3 ppm/° C. This makes it possible to prevent thermal deformation of the first bodies 111 even when the wafer 2 is provided under high temperature.

In detail, the anodic oxide films refer to films formed by anodizing a metal, which is a base material. Each of the anodic oxide films includes a plurality of first pores 111a formed during anodization and having a regular arrangement. When the metal, the base material, is aluminum (Al) or an aluminum alloy, the anodization of the base material forms an anodic oxide film consisting of anodized aluminum ($Al_2O_3$) on the surface of the base material. The anodic oxide film formed as described above includes a barrier layer in which the first pores 111a are not formed and a porous layer in which the first pores 111a are formed. The barrier layer is located on the base material, and the porous layer is located on the barrier layer.

After removing the base material on which the anodic oxide film having the barrier layer and the porous layer is formed, only the anodic oxide film consisting of anodized aluminum ($Al_2O_3$) remains. In this case, when the barrier layer is removed, the anodic oxide film has a structure that consists of anodized aluminum ($Al_2O_3$) and is configured as a substantially thin plate shape, with the first holes 111a having a uniform diameter and vertically passing through the anodic oxide film from top to bottom while forming a regular arrangement. The anodic oxide film with the barrier layer removed as described above may be used as each of the first bodies 111.

When the first body 111 is provided by the removal of the barrier layer, particles generated during the formation of the anodic oxide film or generated during the formation of a first pin insertion hole 112 which will be described later may be captured in the first pores 111a. When the probe card 1 is operated, the captured particles may be scattered and guided to the first pin insertion hole 112 to be moved to the wafer 2. That is, the particles captured in the first pores 111a may have an undesirable influence on the wafer 2.

In order to avoid the above problem, the first bodies 111 may be used without removing uppermost and lowermost barrier layers. That is, the first pores 111a may not be exposed at an upper portion of an uppermost first body ill and at a lower portion of a lowermost first body 111.

The respective first pores 111a are present independently of each other in each of the first bodies 111. In other words, in the first body 111 consisting of anodized aluminum ($Al_2O_3$), a number of first pores 111a having an inner width of several nm to several hundred nm may be formed to pass through the first body 111.

A plurality of first pin insertion holes 112 is further formed in the first body 111 in addition to the first pores 111a that are naturally formed during the anodization of the metal base material. The first pin insertion holes 112 have a structure that pass through the first body 111 from top to bottom.

The first pin insertion holes 112 provide spaces into which the probe pins 20 are inserted. Each of the first insertion holes 112 is formed to have a width larger than the width of each of the first pores 111a. In detail, the first pin insertion holes 112 may be formed in all the first bodies 111 provided as a plurality of layers. When the first bodies 111 provided as the plurality of layers are stacked on top of each other, the first pin insertion holes 112 formed in the respective first bodies 111 may be arranged on the same vertical lines. That is, a part of each of the probe pins 20 may be vertically inserted into each of the first pin insertion holes 112.

The first pin insertion holes 112 may be formed by etching the first bodies 111. Herein, a first mask layer 113 is provided on an upper portion or a lower portion of each of the plurality of first bodies 111. Each of the respective first mask layers 113 has patterns formed at a predetermined interval, and is made of an adhesive material on the upper portion or the lower portion of the first body 111. In one example, the first mask layer 113 may be made of an epoxy resin, and the patterns of the first mask layer 113 may be through-holes corresponding to the first pin insertion holes 112. Furthermore, the first mask layer 113 may be provided transparently so as not to influence the transmittance of the first body 111. A specific method of forming the first pin insertion holes 112 will be described later.

A buffer part 114 may be provided at least partially on each of an upper portion and a lower portion of the first guide plate 110. In the embodiment, the buffer part 114 may be provided at least partially on each of the upper portion of the uppermost first body 111 and the lower portion of the lowermost first body 111. The respective buffer parts 114 serve to prevent damage to the first bodies 111 due to the respective pin holding portions 210 of the probe pins 20. The buffer parts 114 may be made of a polymer or an SU-8 photoresist. Herein, the buffer parts 114 may be provided transparently so as not to influence the transmittance of the first bodies 111. That is, the first bodies 111, the first mask layers 113, and the buffer parts 114 may all be provided transparently. The specific role of the buffer parts 114 will be described later.

The second guide plate 120 is provided below the first guide plate 110. The second guide plate 120 is provided to be spaced apart from the first guide plate 110 by a predetermined distance, and includes a plurality of second bodies 121. Herein, the second bodies 121 may be opaquely provided. In detail, the second bodies 121 may be provided as anodic oxide films like the first bodies 111. However, in order to impart opaque properties to the second bodies 121, a process of coloring the surface of the anodic oxide films may be further performed. Alternatively, the second bodies 121 may be opaquely provided by sealing pores 121a of the anodic oxide films with an opaque material. That is, since the first guide plate 110 provided above the second guide plate 120 is provided transparently while the second guide plate 120 is provided opaquely, there is obtained an effect in that when a user looks at the guide plate 10 from above to insert the probe pins 20, the second guide plate 120 is visible to the user.

The second bodies 121 are provided as anodic oxide films having a low coefficient of thermal expansion. This makes it possible to prevent the second bodies 121 from being influenced by the high temperature wafer 2 and being thermally deformed. In particular, when both the first bodies 111 and the second bodies 121 are provided as anodic oxide films, the first guide plate 110 and the second guide plate 120 have the same coefficient of thermal expansion, thereby making it possible to prevent a positional misalignment between the first guide plate 110 and the second guide plate 120 from occurring due to heat of the wafer 2.

In the present exemplary embodiment, as illustrated in FIG. 2, it will be described that each of the second bodies 121 is provided as an anodic oxide film including a plurality of pores 121a. However, the material of the second bodies 121 is not limited thereto. In one example, the second bodies 121 may be made of a ceramic material to be provided opaquely. Furthermore, although the guide plate 10 in FIG. 2 is illustrated as the second guide plate 120 for convenience, the guide plate 10 in FIG. 2 may be the first guide plate 110 except for the buffer parts 114.

The second guide plate 120 includes a plurality of second pin insertion holes 122 passing through the second bodies 121 from top to bottom. The second pin insertion holes 122 provide spaces through which the probe pins 20 passing through the first pin insertion holes 112 pass. Each of the second pin insertion holes 122 is formed to have a size equal to each of the first pin insertion holes 112. In detail, the second pin insertion holes 122 may be formed in all the second bodies 121 provided as a plurality of layers. When the second bodies 121 provided as the plurality of layers are stacked on top of each other, the second pin insertion holes 122 formed in the respective second bodies 121 may be arranged on the same vertical lines. That is, a part of each of the probe pins 20 may be vertically inserted into each of the second pin insertion holes 122.

When the first bodies 111 and the second bodies 121 are located on the same vertical lines, the first pin insertion holes 112 and the second pin insertion holes 122 are not located on the same vertical lines. In detail, each of the probe pins 20 may not be formed to have a vertical shape, but have a shape having one side bent. In order for the probe pin 20 to be positioned to pass through both each of the first pin insertion holes 112 and each of the second pin insertion holes 122, the first pin insertion hole 112 and the second pin insertion hole 122 may be located on different vertical lines such that the arrangement thereof conforms to a bent shape of the probe pin 20.

The second pin insertion holes 122 may be formed by etching the second bodies 121. Herein, a second mask layer 123 is provided on an upper portion or a lower portion of each of the plurality of second bodies 121. Each of the respective second mask layers 123 has patterns formed at a predetermined interval, and is made of an adhesive material on the upper portion or the lower portion of the second body 121. In one example, the second mask layer 123 may be made of an epoxy resin, and the patterns of the second mask layer 123 may be through-holes 123a corresponding to the second pin insertion holes 122. A specific method of forming the second pin insertion holes 122 will be described later.

A support part 130 is provided between the first guide plate 110 and the second guide plate 120. The support part 130 serves to support the first guide plate 110 and the second guide plate 120 such that the first guide plate 110 and the second guide plate 120 maintain a predetermined distance therebetween. The support part 130 may be coupled to the first guide plate 110 and the second guide plate 120 by a coupling pin 140. In detail, the support part 130 may be provided at each of one side and the other side between the first guide plate 110 and the second guide plate 120, and may be provided at a position that does not overlap the probe pins 20 passing through the first guide plate 110 and the second guide plate 120. In one example, two support parts 130 may be provided respectively at left and right sides of an upper portion of the second guide plate 120, i.e., a lower portion of the first guide plate 110, and the probe pins 20 may pass through a central side between the first guide plate 110 and the second guide plate 120.

Figure 3A:
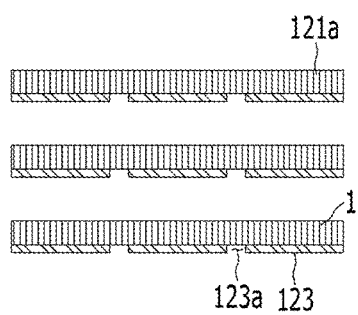
FIGS. 3A, 3B, and 3C are sectional views illustrating that through-holes are formed in the guide plate for the probe card of FIG. 2.
Figure 3B:
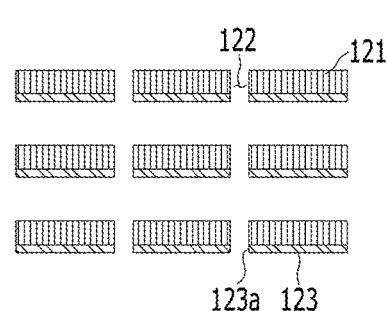
Figure 3C:
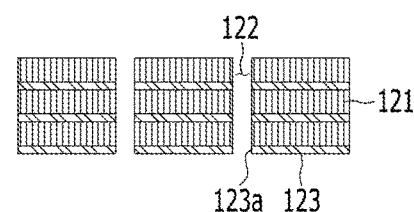

FIGS. 3A, 3B, and 3C are sectional views illustrating that through-holes are formed in the guide plate for the probe card of FIG. 2. Herein, although the guide plate 10 in FIGS. 3A, 3B, and 3C is illustrated as the second guide plate 120 for convenience, the guide plate 10 in FIGS. 3A, 3B, and 3C may be the first guide plate 110. In the present exemplary embodiment, the formation of the second pin insertion holes 122 of the second guide plate 120 will be described as an example, and the formation of the first pin insertion holes 112 of the first guide plate 110 will be the same.

Referring to FIGS. 3A, 3B, and 3C, the second mask layer 123 is provided on the lower portion of each of the plurality of second bodies 121. Herein, each of the respective second mask layers 123 may include through-holes 123a having a predetermined size, and may be provided in a form of a film. The second mask layers 123 may be formed by adhering to the lower portions of the second bodies 121 (see FIG. 3A).

When the second bodies 121 to which the second mask layers 123 are adhered are etched with an etching solution, a part of each of the second bodies 121 is removed along the through-holes 123a (see FIG. 3B). That is, removal portions corresponding to the through-holes 123a may be formed at the second body 121, and these respective removal portions may define second pin insertion holes 122.

Each of the second bodies 121 in which the second pin insertion holes 122 are formed may be adhered to each other through the second mask layers 123 (see FIG. 3C). In detail, the second mask layers 123 may be made of an adhesive material, and thus, the second bodies 121 provided as the plurality of layers may be adhered to each other therethrough. Herein, the adhesion of the second bodies 121 is performed in such a manner that the respective second pin insertion holes 122 of the second bodies 121 are located on the same vertical lines.

FIGS. 4A, 4B, 4C, 4D, and 4E are sectional views illustrating that the probe pins are inserted into the guide plate for the probe card of FIG. 1.

Referring to FIGS. 4A, 4B, 4C, 4D, and 4E, the first guide plate 110 and the second guide plate 120 may be provided by being coupled to each other by the coupling pins 140 with the support parts 130 interposed therebetween (see FIG. 4A). Herein, the first pin insertion holes 112 and the second pin insertion holes 122 may be located on different vertical lines.

The probe pins 20 may be inserted from the upper portion of the first guide plate 110 (see FIG. 4B). In detail, each of the probe pins 20 may be configured such that an upper portion thereof is vertical, a central portion thereof is bent, and a lower portion thereof is vertical. Furthermore, the pin holding portion 210 may be formed on the vertical upper portion of the probe pin 20.

The probe pins 20 may sequentially pass through the first guide plate 110 and the second guide plate 120. Herein, since the first guide plate 110 made of a transparent material is provided at an upper position and the second guide plate 120 made of an opaque material is provided at a lower position, the user can easily identify the first pin insertion holes 112 and the second pin insertion holes 122 that are located on different vertical lines. That is, there is obtained an effect of facilitating the insertion of the probe pins 20.

The user may insert the probe pins 20 in such a manner that the vertical upper portion of each of the probe pins 20 is located in each of the first pin insertion holes 112, the vertical lower portion is located in each of the second pin insertion holes 122, and the bent central portion is located between the first guide plate 110 and the second guide plate (see FIG. 4C). Herein, the pin holding portion 210 of the probe pin 20 may be made of an elastic material, so that the second pin holding portion 212 may pass through the first pin insertion hole 112 in a folded state and then be unfolded to an original state after passing through the first pin insertion hole 112.

When the probe pins 20 pass through the guide plate 10, the respective first pin holding portions 211 may come into contact with the buffer parts 114 provided on the upper portion of the first guide plate 110 and the respective second pin holding portions 212 may come into contact with the buffer parts 114 provided on the lower portion of the first guide plate 110.

The wafer 2 may be provided below the guide plate 10 through which the probe pins 20 passes (see FIG. 4D). Herein, the plurality of probe pins 20 may be provided at positions corresponding to terminals of the wafer 2.

When the probe pins 20 come into contact with the terminals of the wafer 2 and testing is performed, the probe pins 20 may be shaken up and down due to the contact with the wafer 2. Herein, the probe pins 20 made of an elastic material are elastically deformed, and the position of the pin holding portions 210 is changed thereby (see FIG. 4E). Accordingly, the contact area between the pin holding portions 210 in contact with the buffer parts 114 and the buffer parts 114 may be changed, or a phenomenon in which the contact between the buffer parts 114 and the pin holding portions 210 is released may repeatedly occur. In this case, the pin holding portions 210 may damage the surfaces of the first bodies 111 if the buffer parts 114 are not provided. However, due to the buffer parts 114 provided on the upper portion and the lower portion of the plurality of first bodies 111, it is possible to prevent the surfaces of the first bodies 111 from being damaged. In other words, due to the configuration of the buffer parts 114, there is obtained an effect of preventing the surface of the first guide plate 110 from being damaged.

Furthermore, due to the provision of the first and second mask layers 113 and 123 of an adhesive material provided respectively between the layers of the first guide plate 110 configured with the plurality of layers and the layers of the second guide plate 120 configured with the plurality of layers, there is obtained an effect of facilitating joining of the layers of each of the first guide plate 110 and the second guide plate 120, while enabling etching of the first pin insertion holes 112 and the second pin insertion holes 122. In other words, the mask layers 113 and 123 can achieve not only a function as masks for an etching solution during formation of the first and second pin insertion holes 112 and 122, but also a function as joining layers for the first bodies 111 and the second bodies 121, respectively, during joining of the first bodies 111 and joining of the second bodies 121. This makes it possible for the first and second pin insertion holes 112 and 122 respectively formed in the first and second bodies 111 and 121 to be easily aligned to form vertical through-holes.

While particular embodiments of the guide plate for the probe card and the probe card having the same according to the present invention have been described, it is merely illustrative and is not intended to limit the scope of the present invention and should be construed as having widest range based on the spirit of present invention. Those of ordinary skill in the art may combine and substitute the disclosed embodiments to perform a particular pattern of shape that has not been noted, but it is also within the scope of the present invention. It will be apparent to those of ordinary skill in the art that various changes and modifications may be readily made without departing from the spirit and scope of the invention.

What is claimed is:

1. A probe card, comprising:
    a first guide plate including a plurality of first pin insertion holes formed therein, and made of an anodic oxide film;
    a second guide plate disposed to be spaced apart from the first guide plate by a predetermined distance, and including a plurality of second pin insertion holes; and
    a plurality of probe pins each of which includes a protrusion-shaped pin holding portion, and sequentially inserted into and guided into the first pin insertion holes and the second pin insertion holes,
    wherein a buffer part is provided on each of an upper portion and a lower portion of the first guide plate, and
    the pin holding portion of each of the probe pins comes into contact with the respective buffer parts.

2. The probe card of claim 1, wherein the first guide plate is provided transparently, and the second guide plate is provided opaquely.

3. The probe card of claim 2, wherein the second guide plate is provided by coloring a surface of an anodic oxide film.

4. The probe card of claim 2, wherein the second guide plate is made of a ceramic material.

5. The probe card of claim 1, wherein the buffer part is made of a polymer or an SU-8 photoresist.

6. The probe card of claim 1, wherein the buffer part is made of a transparent material.

7. The probe card of claim 1, further comprising:
    a mask layer made of an adhesive material on an upper portion or a lower portion of each layer of each of the first guide plate and the second guide plate, the first guide plate and the second guide plate each of which is configured with a plurality of layers, and the mask layer including through-holes corresponding to the first pin insertion holes and the second pin insertion holes.

8. The probe card of claim 7, wherein the mask layer is made of an epoxy resin.

9. The probe card of claim 7, wherein the mask layer is made of a transparent material.

* * * * *